United States Patent [19]

Chapple-Sokol et al.

[11] Patent Number: 5,354,707
[45] Date of Patent: Oct. 11, 1994

[54] METHOD OF MAKING SEMICONDUCTOR QUANTUM DOT LIGHT EMITTING/DETECTING DEVICES

[75] Inventors: Jonathan D. Chapple-Sokol, Poughkeepsie; Seshadri Subbanna, Hopewell Junction; Manu J. Tejwani, Yorktown Heighs, all of N.Y.

[73] Assignee: International Business Machines Corporation, Armonk, N.Y.

[21] Appl. No.: 149,394

[22] Filed: Nov. 9, 1993

Related U.S. Application Data

[62] Division of Ser. No. 37,154, Mar. 25, 1993, Pat. No. 5,293,050.

[51] Int. Cl.$^5$ .................... H01L 21/203; H01L 31/18
[52] U.S. Cl. .................... 437/106; 437/110; 437/127; 437/131; 437/905; 437/2; 437/3; 148/DIG. 99
[58] Field of Search ............... 437/106, 110, 127, 131, 437/905, 2, 3; 148/DIG. 99

[56] References Cited

U.S. PATENT DOCUMENTS

| | | | |
|---|---|---|---|
| 4,591,889 | 5/1986 | Gossard et al. | 357/4 |
| 4,802,181 | 1/1989 | Iwata | 372/45 |
| 4,861,393 | 8/1989 | Bean et al. | 437/110 |
| 5,061,970 | 10/1991 | Goronkin | 357/12 |
| 5,070,375 | 12/1991 | Sakai | 357/4 |
| 5,073,893 | 12/1991 | Kondou | 372/45 |
| 5,075,742 | 12/1991 | Gerard et al. | 357/17 |
| 5,079,601 | 1/1992 | Esaki et al. | 357/17 |
| 5,084,411 | 1/1992 | Laderman et al. | 437/131 |
| 5,140,152 | 8/1992 | VanZeghbroeck | 250/214 |
| 5,202,284 | 4/1993 | Kamins et al. | 437/106 |
| 5,256,550 | 10/1993 | Laderman et al. | 437/131 |

FOREIGN PATENT DOCUMENTS 139970 5/1990 Japan .................... 257/17

OTHER PUBLICATIONS

C. E. Aumann, Y-W. Mo, M. G. Lagally, App. Phys. Lett. 59(9) 26, Aug. 1991, pp. 1061-1063. "Diffraction determination of the structure of metastable three-dimensional crystals of Ge grown on Si(001)".

Y. Koide, S. Zaima, N. Ohshima & Y. Yasuda, Japanese Journal of Applied Physics vol. 28, No. 4, Apr. 1989, pp. L690-L693, "Initial Stage of Growth of Ge on (100) Si by Gas Source Molecular Beam Epitaxy Using GeH4".

M. Fujii, S. Hayashi & K. Yamamoto, 20th International Conference on the Physics of Semiconductors, vol. 3, pp. 2375-2378 (1990) "Quantum Dots of Ge Embedded in SiO2 Thin Films: Optical Properties".

Heath and Jasinski, "Light Emission from Silicon", Mat. Res. Soc. Symp. Proc. vol. 256, 1992 Materials Res., pp. 117-122.

Sercal, et al., "Type II Broken-Gap Quantum Wire and Quantum Pot Arrays: A Novel Concept for Self-Doping Semiconductor Nanostructures" Appl. Phys. Lett. 57(15), 8 Oct. '90 pp. 1569-1571.

*Primary Examiner*—R. Bruce Breneman
*Assistant Examiner*—Linda J. Fleck
*Attorney, Agent, or Firm*—Richard Lau

[57] ABSTRACT

A semiconductor light emitting/detecting device has a first doped silicon layer, an intrinsic silicon epitaxial layer formed on the first doped silicon layer, at least one quantum dot embedded within the intrinsic silicon epitaxial layer, and a second doped silicon layer formed on the second intrinsic silicon epitaxial layer.

12 Claims, 3 Drawing Sheets

5,354,707

METHOD OF MAKING SEMICONDUCTOR QUANTUM DOT LIGHT EMITTING/DETECTING DEVICES

RELATED U.S. APPLICATION DATA

This application is a divisional application of U.S. Ser. No. 08/037,154, filed Mar. 25, 1993, now U.S. Pat No. 5,293,050.

TECHNICAL FIELD

The present invention relates generally to semiconductor devices and, more particularly, to optical interconnects for semiconductor devices.

BACKGROUND OF THE INVENTION

As semiconductor integrated circuit technology progresses, circuit designers are continually striving to improve circuit performance. One enhancement that can significantly improve circuit performance is increasing of circuit speed. Circuit speed can be increased by improving interconnections between components and/or chips. Traditionally, conventional wiring has been used for such interconnections. Disadvantages commonly associated with conventional wiring schemes include excessive noise, significant delay time, crosstalk, etc. These disadvantages can adversely affect circuit speed, and thus must be taken into consideration by an integrated circuit designer when attempting to optimize circuit speed by improving interconnections.

An alternative to conventional wiring is optical interconnects. Many of the disadvantages associated with conventional wiring do not exist with optical interconnects, and thus optical interconnects can increase circuit speed. Accordingly, utilization of optical interconnects can be attractive for circuit designers seeking to enhance and improve semiconductor circuit performance.

Optical interconnects have previously been implemented with direct bandgap material in Group III-V semiconductor technology, particularly gallium arsenide based technology. As a matter of fact, in GaAs based technology, use of optical interconnects is well known and commonplace, and has been proven to operate faster and function more effectively than wires, by eliminating the above-outlined problems associated with wires. In this regard, it has been demonstrated in GaAs based technology that direct bandgap material can be readily made to lase or emit light for forming optical interconnects.

However, in contrast to direct bandgap material in Group III-V semiconductor technology, optical interconnects are not as readily implemented with indirect bandgap material in Group IV semiconductor technology, particularly silicon based technology, bipolar or CMOS. Since indirect bandgap material does not ordinarily emit light, it is especially difficult to build a light emitting device or optical interconnect from such material.

Specifically, since it is apparent that two-dimensional Si—Ge quantum wells have no light emission capability, one-dimensional or quantum dots (zero-dimensional) are required in a Si—Ge based technology. See, for example, "Quantum Dots of Ge Embedded in $SiO_2$ Thin Films: Optical Properties", by M. Fujii, S. Hayashi and K. Yamanoto, 20th International Conference on the Physics of Semiconductors, Vol. 3, pp 2375–2378 (1990), which discusses luminescence from microcrystallites of Ge embedded in $SiO_2$, indicating the existence of quantum dots.

Since silicon is the primary material used in present day semiconductor technology, any enhancement, such as interconnection improvement, that will improve circuit speed in silicon semiconductor technology is highly desirable. Accordingly, a need exists for optical interconnects, and thus light emitting/detecting devices, in silicon based semiconductor technology.

OBJECTS OF THE INVENTION

It is therefore an object of the present invention to improve silicon based semiconductor circuit/subsystem performance.

It is another object of the present invention to provide faster silicon based semiconductor circuits.

It is a further object of the present invention to improve interconnections in silicon based semiconductor devices.

It is still another object of the present invention to provide optical interconnects in silicon based semiconductor devices.

SUMMARY OF THE INVENTION

In order to accomplish the above, there is provided a semiconductor light emitting/detecting device and method for fabricating the same. The semiconductor light emitting/detecting device has a first doped silicon layer, and an intrinsic silicon epitaxial layer formed on the first doped silicon layer. At least one quantum dot is embedded within the first intrinsic silicon epitaxial layer, and a second doped silicon layer, of conductivity-type opposite the conductivity type of the first doped silicon layer, is then formed on the second intrinsic silicon epitaxial layer.

The substrate on which the semiconductor light emitting/detecting device is fabricated can be of the conductivity-type of the first or second silicon layer, depending on whether electrical contact to the device or isolation of the device is required.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Although a P-I-N device is shown and described as being fabricated hereinbelow, it should be understood that an N-I-P device can also be fabricated and operate in accordance with the present invention. Selection of device type depends on the particular application in which the device is being used.

Figure 1A:
FIGS. 1A–E are diagrammatic cross-sectional views showing a portion of a substrate during various stages of processing during fabrication of a semiconductor light emitting/detecting device in accordance with one embodiment of the present invention.
Figure 1B:
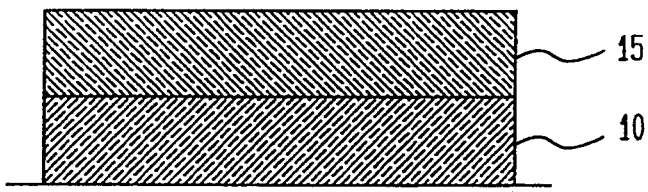

Referring initially to FIG. 1A, a doped N+ silicon layer 10 is provided which may be a substrate, or a layer which is grown or implanted in or upon a substrate using standard techniques. In this example, if the device is being fabricated on a substrate which is N-type, a low resistance interconnect to other devices is provided; if the substrate is P-type, an isolation from other devices is provided. As shown in FIG. 1B, a first intrinsic silicon epitaxial layer 15 is conventionally grown on the N+ silicon layer 10.

Figure 1C:
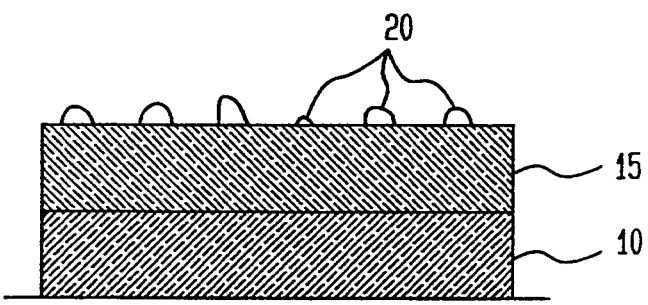

Referring now to FIG. 1C, approximately 10–30 nm of germanium or a silicon-germanium alloy, which is an indirect band-gap material belonging in Group IV of the Periodic Table of the Elements, is deposited on the first intrinsic silicon epitaxial layer 15 so as to form a discontinuous layer of crystalline or amorphous germanium "balls" or isolated germanium islands on the first intrinsic silicon epitaxial layer 15. In this regard, there is a lattice mismatch between Ge and Si; and when Ge is deposited on Si, the lattice mismatch between the materials causes stress to occur such that the Ge will not form as a smooth layer and, instead, form as "balls" or islands of germanium. These "balls" or islands are referred to herein as quantum dots 20. See, generally, "Diffraction Determination of the Structure of Metastable Three-dimensional Crystals of Ge Grown on Si(001)", by C.E. Aumann, Y.W. Mo and M.G. Lagally, Appl. Phys. Lett. 59 (9), Aug. 26, 1991, pps. 1061–1063, American Institute of Physics, which discusses the use of low energy diffraction to confirm the existence of metastable crystalline Ge clusters, on the order of tens of nm in size, grown on silicon; and "Initial Stage of Growth of Ge on (100) Si by Gas Source Molecular Beam Epitaxy Using GeH$_4$", by Y. Koide, S. Zaime, N. Ohshima and Y. Yasuda, Japanese Journal of Applied Physics, Vol 28, No. 4, April 1989, pp. L690–L693, which discusses use of molecular beam epitaxy to grow Ge islands on Si.

Generally, formation of the germanium quantum dots 20 on silicon is achievable over a wide process range, but low temperatures, below approximately 550 degrees Centigrade, are important for controlling dot size and preventing the Ge from interdiffusing with the Si. In this regard, thin layers of Ge are difficult to grow at higher temperatures because of high growth rates. Only Ge, and not Si, can be grown at low temperatures using conventional low pressure chemical vapor deposition (LPCVD). However, both Ge and Si can be grown using either ultrahigh vacuum chemical vapor deposition (UHVCVD), low temperature atmospheric pressure chemical vapor deposition (APCVD), or molecular beam epitaxy (MBE), or other low temperature epitaxial techniques. Moreover, these techniques can be used to deposit the various layers sequentially without exposing the layers to deleterious environments between deposition which can be detrimental to layer quality and light emission efficiency. Therefore, for convenience, either UHVCVD, low temperature APCVD, or MBE can be used for forming the Ge quantum dots 20, as Si can then be grown using the same technique. Ultrahigh vacuum chemical vapor deposition or low temperature APCVD are preferred over MBE from a manufacturability point-of-view.

Illustratively, approximate process parameters for forming the Ge quantum dots 20 using UHVCVD are as follows:

temperature: 415–550 degrees Centigrade
10% Ge in He: 1–100 mTorr
time: 1–60 minutes These parameters will provide a range of "tailored" Ge particle sizes. For example, depositing Ge at approximately 515 degrees Centigrade, and at approximately 15 mTorr for approximately 4 minutes will produce Ge particle sizes or Ge quantum dots having a diameter of approximately 10 nm.

Illustratively, as an example, each quantum dot 20 can have a height or thickness of approximately 10 nm–20 nm and a diameter on order of approximately 10 nm; and each quantum dot 20 can be spaced a distance of approximately 10 nm–20 nm from the next adjacent quantum dot 20. However, the dimensions of the quantum dots 20 and the distance between each quantum dot 20 can be adapted in accordance with the requirements of the particular application and device being fabricated. For example, wavelength of emission can be matched to a waveguide and/or detector for optical signal transmission.

Figure 1D:
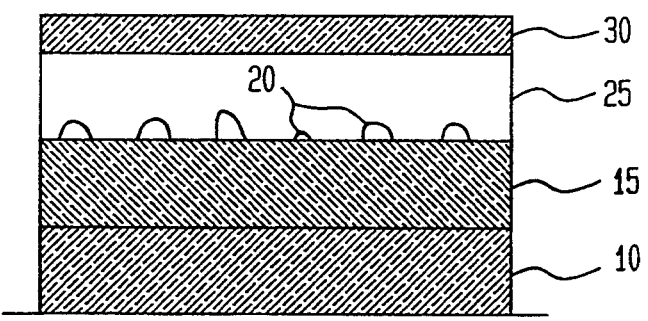

Next, with reference to FIG. 1D, a second intrinsic silicon epitaxial layer 25 is deposited on the first intrinsic silicon epitaxial layer 15, and over the quantum dots 20 so as to embed the quantum dots 20 therein. More specifically, the second intrinsic silicon epitaxial layer 25 is deposited on the first intrinsic silicon epitaxial layer 15 between the quantum dots 20, and is also deposited on the quantum dots 20 so that the quantum dots 20 are embedded within the matrix of the second intrinsic silicon epitaxial layer 25, thus forming a smooth single-crystal layer. In this regard, in order to ensure that the second intrinsic silicon epitaxial layer 25 grows predominantly on the first intrinsic silicon epitaxial layer 15, with lateral overgrowth over and above the Ge quantum dots 20, the density of Ge quantum dots 20 should be adequately low, i.e., the Ge quantum dots 20 should be sufficiently spaced apart from one another. This will maintain crystalline alignment in the second intrinsic silicon epitaxial layer 25, which is characteristic of epitaxial growth and critical to proper electronic behavior of the device. Advantageously, since the quantum dots 20 are discontinuous and thin relative to the second intrinsic silicon epitaxial layer 25, the second intrinsic silicon epitaxial layer 25 will have a low dislocation density.

The second intrinsic silicon epitaxial layer 25 can be grown at the same temperature at which the Ge quantum dots 20 are grown, and such temperature will control the other process parameters used for growing the second intrinsic silicon epitaxial layer 25. Using the temperature of 515 degrees Centigrade as an example, the second intrinsic silicon epitaxial layer 25 can be grown to a thickness of approximately 20 nm, using UHVCVD, with silane at approximately 1–3 mTorr for a time of approximately 30 minutes.

After the second intrinsic silicon epitaxial layer 25 is grown, there is effectively no interface between the first and second intrinsic silicon epitaxial layers 15 and 25. As such, the quantum dots 20 are effectively embedded in a single homogeneous intrinsic layer. Accordingly, the dashed lines in FIG. 1D and FIG. 1E, between layers 15 and 25, and in FIG. 2, reflect steps in the formation process, or single-crystal metallurgical transitions, and not true interfaces.

Figure 2:
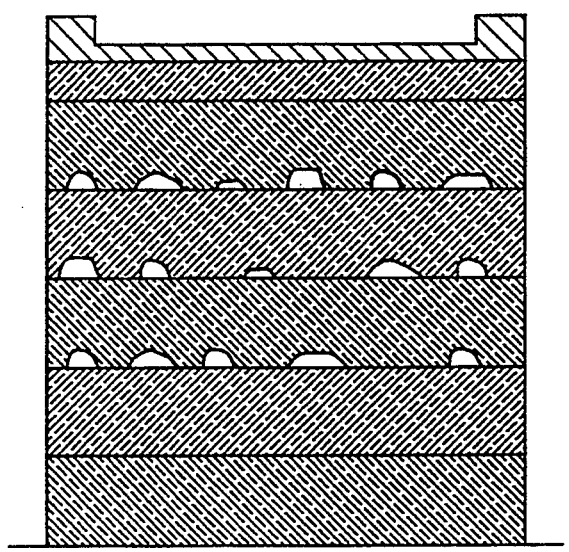
FIG. 2 shows several layers of quantum dots embedded in Si in accordance with the invention.

Illustratively, the second intrinsic silicon epitaxial layer 25 can have a total thickness of approximately 50 nm after completion of the overall process. In this regard, in order to increase the quantity of the Ge quantum dots 20, thin layers of Ge and Si can each be alternately grown on the first intrinsic silicon epitaxial layer 15. The alternate growing can be repeated until the desired quantity of Ge quantum dots 20 is attained. Such a device is shown in FIG. 2. Although FIG. 2 shows three alternating iterations of Ge and Si layers, it should be understood that the device in accordance with the invention is not limited to three such iterations, and as many alternating Ge and Si layers as required can be fabricated. Contamination at the interfaces caused by alternately growing Ge and Si can be prevented by conducting the growing in situ, growing the layers sequentially in a single reactor without exposure to the atmosphere or other deleterious environment following the growth of each layer.

A P+ silicon layer 30 having a thickness of approximately 50–150 nm is then deposited over the second intrinsic silicon epitaxial layer 25.

Figure 1E:
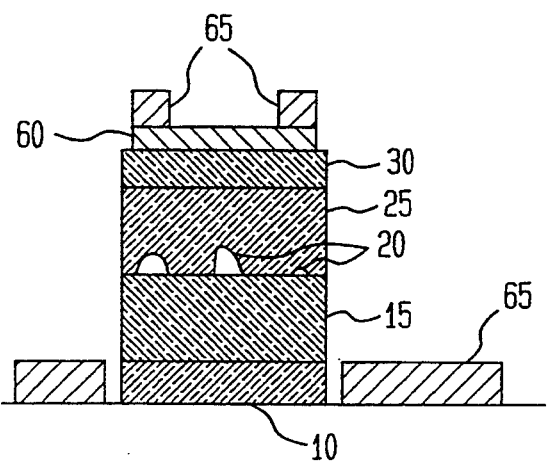

These layers with the Ge quantum dots 20 therein can then be patterned and defined using conventional lithography techniques and reactive ion etch into active light-emitting areas so as to form individual light emitting/detecting devices, such as that shown in FIG. 1E. The light emitting/detecting device can then be used for inter-chip or intra-chip optical communication with other light emitting/detecting devices.

As shown in FIG. 1E, a thin semi-transparent metal contact layer 60 can then be deposited on the light emitting/detecting device, followed by a thick metal contact pad/interconnect 65 for connecting to other silicon circuitry components. These metal layers 60,65 can be deposited using conventional techniques, and then patterned using standard liftoff or reactive ion etching processes. For example, the contact layer 60 can serve as a window for optical contact to optical fibers.

Figure 3:
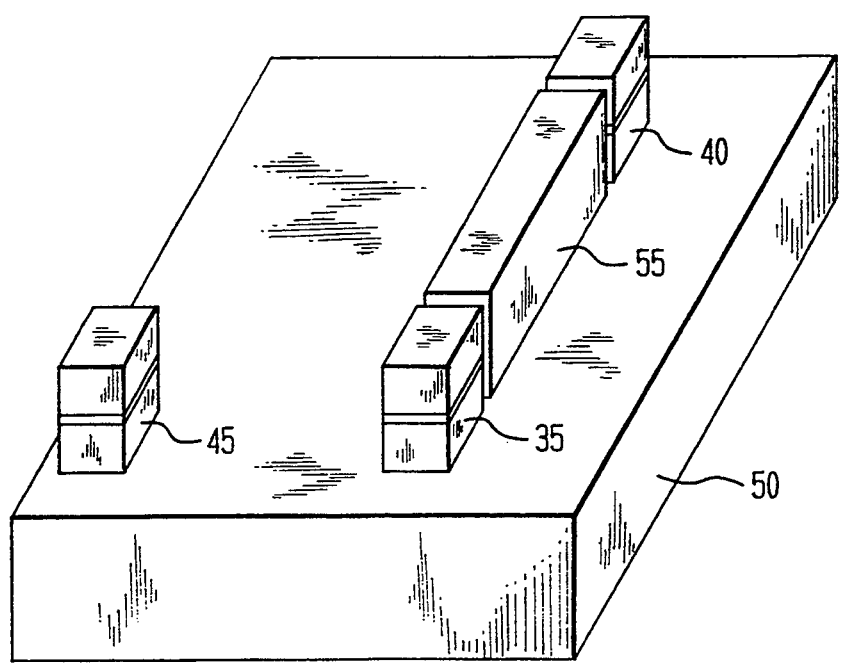
FIG. 3 shows semiconductor light emitting/detecting devices formed on a silicon chip in accordance with the present invention.

Illustratively, FIG. 3 shows light emitting/detecting device structures 35, 40 and 45 in accordance with the present invention formed on a silicon chip 50 having silicon circuitry, for example, logic or memory circuitry, fabricated therein. Because low temperatures are used in the fabrication process, the CMOS device characteristics are not compromised. Each light emitting/detecting device 35, 40 and 45 is fabricated as outlined hereinabove with reference to FIG. 1A-E, and can be fabricated after completion of the silicon circuitry, which may be bipolar or CMOS. However, it should be understood that light emitting/detecting devices can also be fabricated in accordance with the present invention as individual discrete optoelectronic components, i.e., not integrated with other circuitry.

Each light emitting/detecting device 35, 40 and 45 is electrically coupled to an appropriate corresponding component of the silicon circuitry by conventional interconnection means, such as metal wires, diffusion, etc. Optical signals can be isotropically transmitted from one light emitting/detecting device to a standard silicon based photodetector, or to another light emitting/detecting device according to the present invention, operating as a photodiode; or an optical waveguide 55 can be formed to opto-electronically connect various light emitting/detecting devices for directing optical signals as desired. Such an optical waveguide 55 can be conventionally fabricated using, for example, oxide, silicon dioxide, silicon nitride, or any transparent material. Of course, the optical waveguide 55 should be patterned so as to have appropriate angles for properly reflecting and directing the optical signals.

Each light emitting/detecting device 35, 40 and 45 can function as a transducer by converting electrical impulses into optical signals, and vice versa, and is also capable of optically transmitting and receiving light emissions. As an example, operation will be described in the case where the silicon circuitry coupled to light emitting/detecting device 35 needs to communicate with the silicon circuitry coupled to either light emitting/detecting device 40 or 45. The silicon circuitry coupled to light emitting/detecting device 35 sends electrical current through the light emitting/detecting device 35 so as to forward bias the light emitting/detecting device 35, and charge carriers, i.e., holes and electrons, are thus injected into the first and second intrinsic silicon epitaxial layers of the light emitting/detecting device (reference numerals 15 and 25 in FIG. 1). Since Ge has a small bandgap relative to Si, the Ge embedded in the Si forms a series of zero-dimensional quantum wells (or dots); each quantum well having a high collection efficiency. Because of the high collection efficiency, the charge carriers will become trapped or confined in the quantum wells or, more specifically, in the quantum dots within the light emitting/detecting device 35. The charge carriers then radiatively recombine in the quantum dots. The quantum dots are thus electrically "pumped", causing the electrical current flowing from the silicon circuitry to be converted into light emissions or optical signals. These optical signals are then transmitted by the light emitting/detecting device 35 either isotropically through the interlevel dielectric or air to light emitting/detecting device 45, or via the waveguide 55 to light emitting/detecting device 40. In either case, after the light emitting/detecting device 40 or 45 receives the optical signals, the light emitting/detecting device 40 or 45 re-converts the optical signals to electrical current which is sent to the silicon circuitry coupled thereto.

The light emitting/detecting device of the present invention can act as a standard silicon photodiode by absorbing light which is converted into an electron hole pair in the depleted intrinsic region of the device. The electron and hole so formed are separated and swept into the n and p diffused regions of the diode, thus generating an electrical signal. In this regard, any suitable photodetector, not necessarily fabricated in accordance with the present invention, can be used for detecting the optical signal.

Figure 4A:
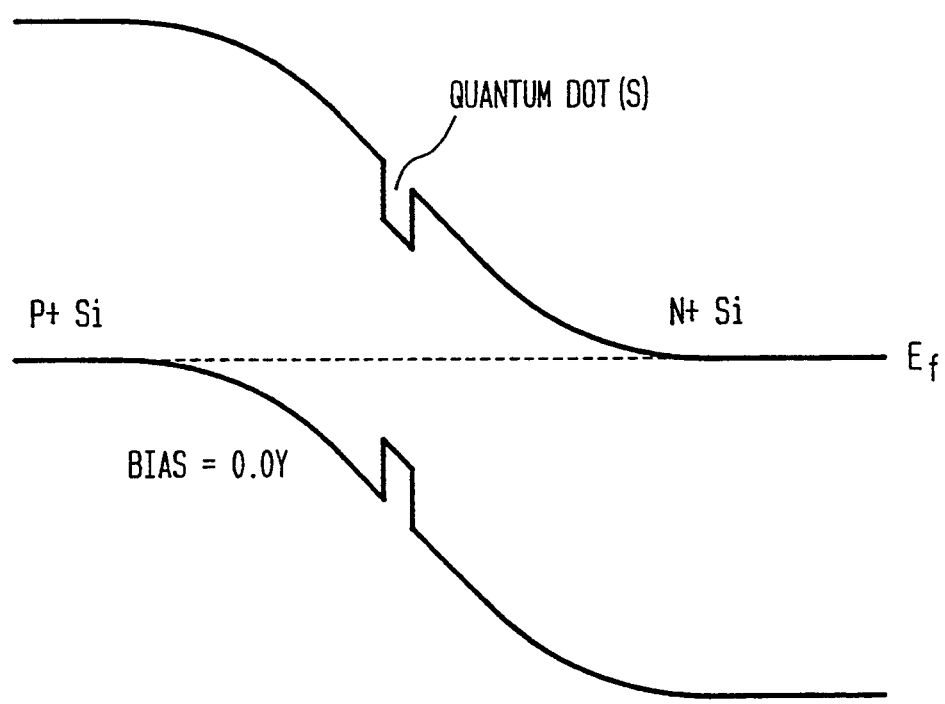
FIG. 4A–B show band structures of the device of the present invention.

As a specific example, Ge quantum dots act as a region of narrower bandgap within the depletion region of a P-I-N diode. In FIG. 4A, it is shown that the transfer of carriers between the energy bands of the Ge quantum dots, residing within the bandgap of the silicon, will not take place. The dashed line in FIG. 4A represents the Fermi Level.

Figure 4B:
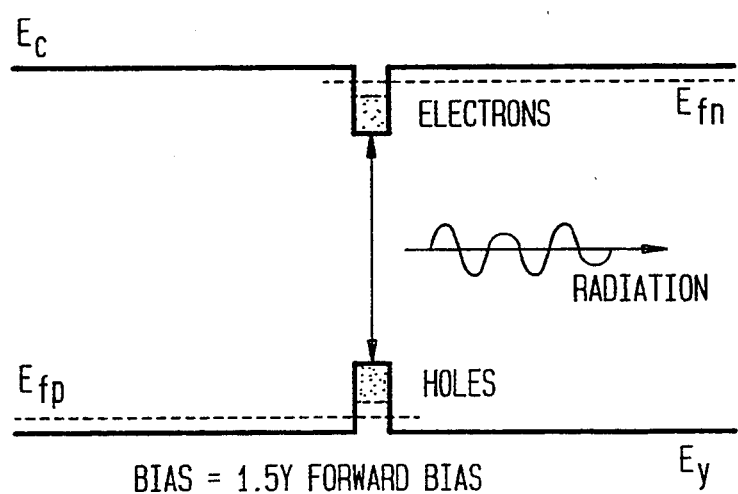

As illustrated in FIG. 4B, when a positive voltage is applied on the p diffused side of the diode (with respect to the n side), the depletion region collapses, and carriers flow between doped regions. The applied field causes a separation of the carriers by conductivity type with holes moving toward the n diffused side and electrons moving toward the p diffused side. This separation of charges causes the Ge quantum dots to fill with carriers. These carriers, which are confined within a geometric volume that is small compared with their wavelength, upon recombining, emit light at a defined wavelength that may be a function of the size of the Ge quantum dot. In a reverse-biased mode, this device should behave like the well-known P-I-N diode detectors. In other words, light absorption creates electron-hole pairs that are separated by the electric field and generate a photo-current that is amplified and detected.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of fabricating a semiconductor light emitting/detecting device, comprising the steps of:
    a) providing a first doped silicon layer of a first conductivity type;
    b) forming a first intrinsic silicon epitaxial layer on said first doped silicon layer;
    c) forming at least one quantum dot on said intrinsic silicon epitaxial layer;
    d) forming a second intrinsic silicon epitaxial layer on said first intrinsic silicon epitaxial layer and over said at least one quantum dot so as to embed said at least one quantum dot therein;
    e) forming a second doped silicon layer of a second conductivity type on said second intrinsic silicon epitaxial layer; and
    f) defining a light emitting/detecting device with said layers and said at least one quantum dot.

2. A method of fabricating a semiconductor light emitting/detecting device according to claim 1, wherein step c) comprises forming said at least one quantum dot using an indirect band-gap material from Group IV of the Periodic Table of the Elements.

3. A method of fabricating a semiconductor light emitting/detecting device according to claim 2, wherein said indirect band-gap material comprises germanium.

4. A method of fabricating a semiconductor light emitting/detecting device according to claim 2, wherein said indirect band-gap material comprises a silicon-germanium alloy.

5. A method of fabricating a semiconductor light emitting/detecting device according to claim 1, wherein step f) comprises lithographic patterning and reactive ion etching.

6. A method of fabricating a semiconductor light emitting/detecting device according to claim 1, wherein step f) comprises lithographic pattening and wet chemical etching.

7. A method of fabricating a semiconductor light emitting/detecting device according to claim 1, wherein step c) and step d) comprises alternately growing germanium and silicon, wherein the germanium forms the quantum dots and the silicon forms the second intrinsic silicon epitaxial layer, and wherein the quantity of quantum dots is increased from the alternate growing.

8. A method of fabricating a semiconductor light emitting/detecting device according to claim 1, wherein step c) and step d) each comprise using a low temperature epitaxial technique.

9. A method of fabricating a semiconductor light emitting/detecting device according to claim 8, wherein said at least one quantum dot and said second intrinsic silicon epitaxial layer are each grown using a low temperature epitaxial technique at approximately the same temperature.

10. A method of fabricating a semiconductor light emitting/detecting device according to claim 1, wherein step c) comprises using ultrahigh vacuum chemical vapor deposition at a temperature of approximately 415–550 degrees Centigrade, with approximately 10% Ge in He at approximately 1–100 mTorr, and for a period of time of approximately 1–60 minutes.

11. A method of fabricating a semiconductor light emitting/detecting device according to claim 1, wherein said second intrinsic silicon epitaxial layer grows predominantly on said first intrinsic silicon epitaxial layer, with lateral overgrowth above said at least one quantum dot.

12. A method of fabricating a semiconductor light emitting/detecting device according to claim 1, wherein step c) and step d) are performed in situ.

* * * * *